United States Patent [19]

Hurst et al.

[11] Patent Number: 4,870,530
[45] Date of Patent: Sep. 26, 1989

[54] ELECTROSTATIC DISCHARGE PROTECTION CIRCUITRY FOR ANY TWO EXTERNAL PINS OF AN I.C. PACKAGE

[75] Inventors: Roger S. Hurst; Glen Gilfeather, both of Austin, Tex.

[73] Assignee: Advanced Micro Devices, Inc., Sunnyvale, Calif.

[21] Appl. No.: 212,282

[22] Filed: Jun. 27, 1988

[51] Int. Cl.[4] .......................... H02H 3/20; H02H 9/04
[52] U.S. Cl. ........................................ 361/91; 361/56; 361/111; 357/23.13
[58] Field of Search ....................... 361/54, 56, 91, 111, 361/117–119, 212, 220; 357/23.13; 307/540, 541, 542, 547

[56] References Cited

U.S. PATENT DOCUMENTS

| | | | |
|---|---|---|---|
| 3,626,249 | 12/1971 | Snedeker | 361/56 |
| 4,079,211 | 3/1978 | Janssen | 361/56 X |
| 4,484,244 | 11/1984 | Avery | 361/91 X |
| 4,631,567 | 12/1986 | Kokado et al. | 361/91 X |
| 4,686,602 | 8/1987 | Bucksch | 361/111 X |

Primary Examiner—A. D. Pellinen
Assistant Examiner—A. Jonathan Wysocki
Attorney, Agent, or Firm—Davis Chim

[57] ABSTRACT

A protective circuit for bipolar integrated circuits to prevent inadvertent damage caused by electrostatic discharge includes a plurality of clamping networks (12a–12n). Each of the plurality of clamping networks (12a–12n). is connected between a corresponding one of a number of external input/output pins (P1–Pn) of the integrated circuit and a common bus line (14) which is connected to an external substrate pin (PS). Each of the plurality of clamping networks (12a–12n) includes a silicon-controlled rectifier (T1), a diode (D1), a first resistor (R1) and a second resistor (R2). When any one of the number of external input/output pins (P1–Pn) receives a voltage higher than a predeter-mined value and any remaining one of the external input/output pins (P1–Pn) contacts a ground potential, a discharge path is formed by a single silicon-controlled rectifier and a single diode so as to protect an internal circuit portion.

3 Claims, 2 Drawing Sheets

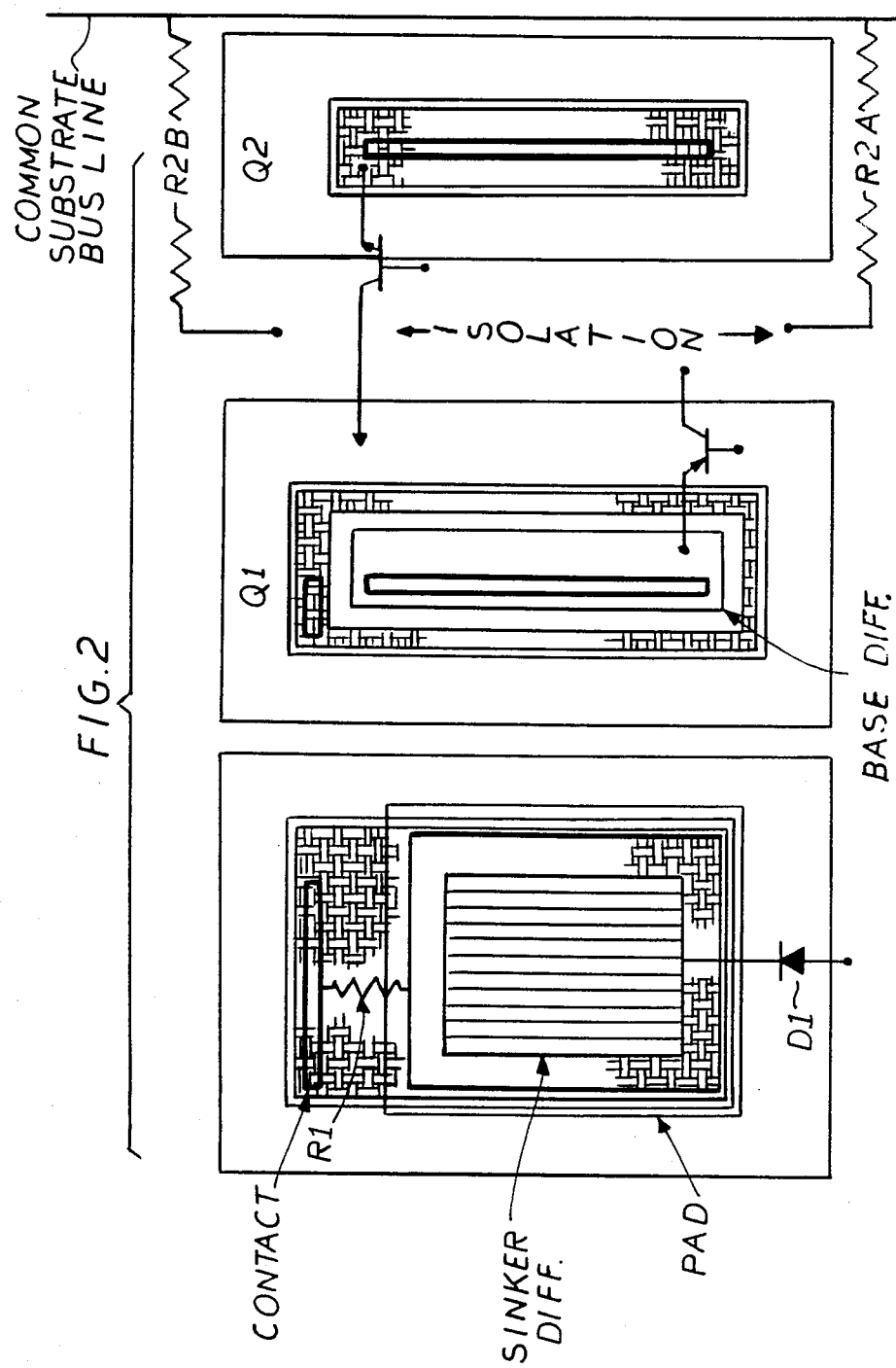

ELECTROSTATIC DISCHARGE PROTECTION CIRCUITRY FOR ANY TWO EXTERNAL PINS OF AN I.C. PACKAGE

BACKGROUND OF THE INVENTION

This invention relates generally to semiconductor protection circuitry and more particularly, it relates to a protection circuit for semiconductor integrated circuits having bipolar transistors to prevent inadvertent damage caused by electrostatic discharge (ESD) occurring between any two of the external connector terminals or pins of an integrated circuit package.

Generally, ESD protection circuitry of the prior art consisted of a small diode, a Zener diode or a transistor connected between either an input pin or an output pin and a power supply pin. These prior art ESD protection circuitry had the drawback of being unable to handle large currents. Another drawback is that the prior art protection circuits offered protection to the input or output pin only when the power supply pin was made to come in contact with a ground potential. Thus, these prior art protection circuits offered no protection when another input or output pin was the one referenced to ground. Further, no discharge path existed when the ESD occurred at the power supply pin.

Since the build-up of such electrostatic charges could be applied typically during handling to any one of the plurality of external connector terminals or pins of the integrated circuit package, a discharging occurs when any one of the remaining pins comes into contact with the ground potential. As a consequence, the discharging could occur, in essence, between any one of the external pins and any one of the other remaining pins.

It is also known that thyristors are generally useful as ESD protection structures due to their ability to handle large amounts of power. In particular, the thyristors have the characteristic of being able to hold off high voltage at low reverse current in the blocking state but yet can conduct high currents with low voltage drops in the forward conduction state. The use of thyristors as protection devices is discussed in a published article entitled "Using SCR's As Transient Protection Structures in Integrated Circuits" by L. R. Avery, RCA DSRC, pages 177-180. However, the article by Avery teaches only the use of two thyristors for protection against both positive and negative transients.

It would therefore be desirable to provide a protection circuit for semiconductor integrated circuits having bipolar transistors to prevent inadvertent damage caused by electrostatic discharge occurring between any pin and any other remaining pin of the integrated circit package. The protection circuit of the present invention includes a plurality of clamping networks. Each of the clamping networks includes a single thyristor and a single diode connected between each external input/output pin and an external substrate pin of the integrated circuit package.

SUMMARY OF THE INVENTION

Accordingly, it is a general object of the present invention to provide an improved protection circuit for semiconductor integrated circuits having bipolar transistors to prevent inadvertent damage caused by electrostatic discharge which is relatively simple and economical to manufacture and assemble, but yet overcomes the disadvantages of the prior art protection circuitry.

It is an object of the present invention to provide a protection circuit for semiconductor integrated circuits having bipolar transistors to prevent inadvertent damage caused by electrostatic discharge occurring between any two external pins of the integrated circuit package.

It is another object of the present invention to provide a protection circuit for semiconductor integrated circuits having bipolar transistors which includes a plurality of clamping networks, each being formed of a single silicon-controlled rectifier and a single diode.

It is still another object of the present invention to provide a protection circuit for semiconductor integrated circuits having bipolar transistors which includes a plurality of clamping networks, each being formed of a single silicon-controlled rectifier, a single diode, a first resistor and a second resistor.

In accordance with these aims and objectives, the present invention is concerned with the provision of a protection circuit for semiconductor integrated circuits having bipolar transistors to prevent inadvertent damage caused by electrostatic discharge which includes a plurality of clamping networks. Each of the plurality of clamping networks is connected between a corresponding one of a number of external inputs/output pins of the integrated circuit and a common bus line which is connected to an external substrate pin. Each of the plurality of clamping networks includes a silicon-controlled rectifier, a diode, a first resistor, and a second resistor.

The silicon-controlled rectifier is formed of a PNP-type bipolar transistor and an NPN-type bipolar transistor. The PNP-type transistor has its emitter connected to the corresponding external input/output pin, its base connected to the collector of the NPN-type transistor at a corresponding node, and its collector connected to the base of the NPN-type transistor. The NPN-type transistor has its emitter connected to the common bus line. The diode has its cathode connected to the emitter of the PNP-type transistor and its anode connected to the common bus line. The first resistor has its one end connected to the emitter of the PNP-type transistor and its other end connected to the base of the PNP-type transistor. The second resistor has its one end connected to the base of the NPN-type transistor and its other end connected to the emitter of the NPN-type transistor.

An internal circuit portion to be protected from the electrostatic discharge is connected between the corresponding node and the common bus line. When any one of the number of external input/output pins receives a voltage higher than a predetermined value and another remaining one of the external input/output pins contacts a ground potential, a discharge path is formed by a single silicon-controlled rectifier and a single diode so as to protect the internal circuit portion.

BRIEF DESCRIPTION OF THE DRAWINGS

These and other objects and advantages of the present invention will become more fully apparent from the following detailed description when read in conjunction with the accompanying drawings, with like reference numerals indicating corresponding parts throughout, wherein:

FIG. 2 is a plan view (top) layout of a clamping network in the protection circuit of FIG. 1.

DESCRIPTION OF THE PREFERRED EMBODIMENT

Figure 1:
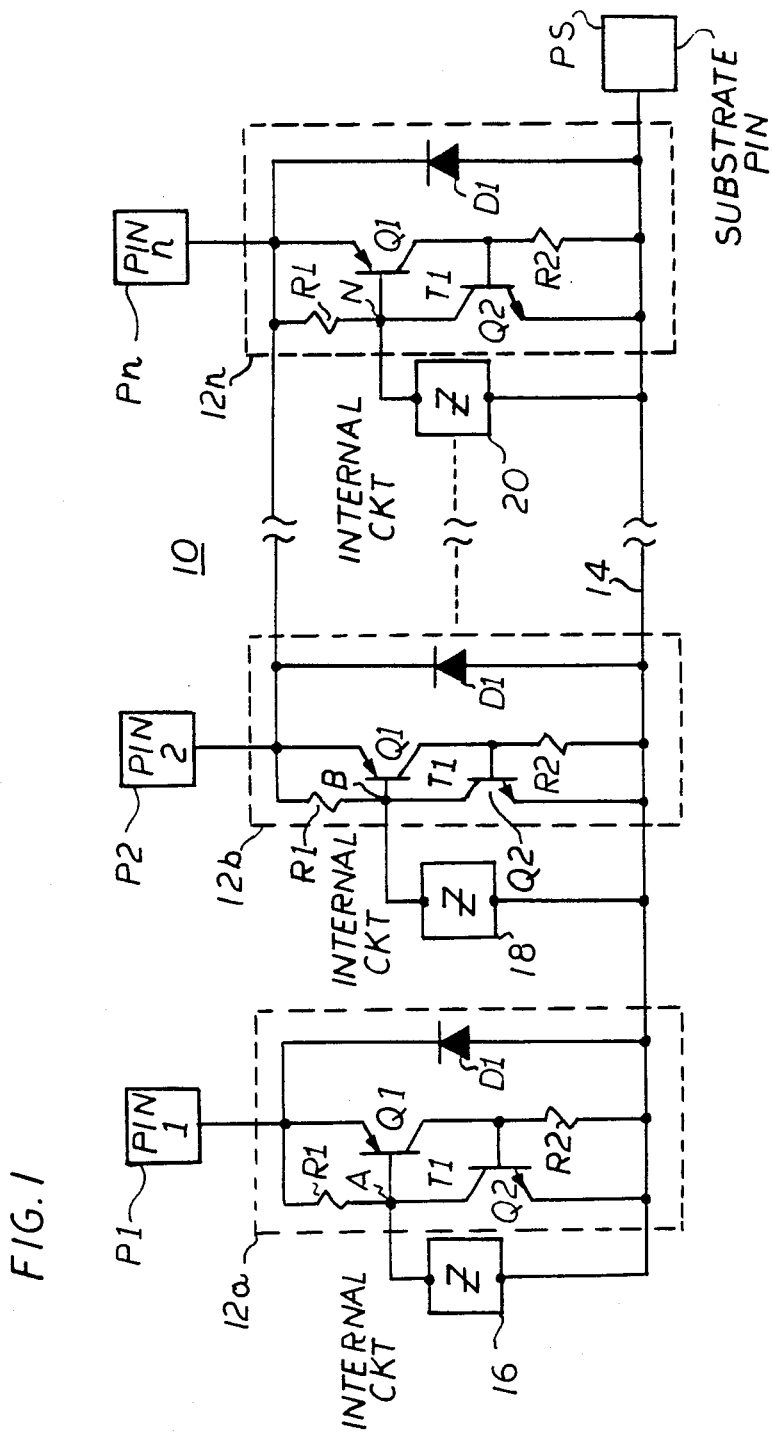
FIG. 1 is a schematic circuit diagram of an ESD protection circuit of the present invention.

Referring now in detail to the drawings, there is shown in FIG. 1 a schematic circuit diagram of a protection circuit 10 for semiconductor integrated circuits having bipolar transistors, constructed in accordance with the principles of the present invention. The protection circuit 10 is used to prevent inadvertent damage caused by electrostatic discharge (ESD) encountered during handling of the integrated circuit. In order to prevent the semiconductor integrated circuit from being damaged or destroyed when the ESD occurs between any one of the plurality of external pins of the integrated circuit package and any one of the other remaining external pins, the protection circuit 10 of the present invention includes a plurality of clamping networks 12a–12n, each being formed of a single thyristor or silicon-controlled rectifier T1, a single diode D1, a first resistor R1, and a second resistor R2.

Each of the plurality of clamping networks 12a–12n is connected between a corresponding one of the external input/output pins P1–Pn of the semiconductor integrated circuit (not shown) and a single common bus (substrate) line 14. The common bus line 14 is connected to an external substrate pin PS, which serves as a ground connection point for the integrated circuit. The clamping network 12a is connected between the external input/output pin P1 and the bus line 14. Similarly, the clamping network 12b is connected between the external input/output pin P2 and the bus line 14. Finally, the clamping network 12n is connected between the external input/output pin Pn and the common bus line 14.

A circuit portion 16 of an internal circuit (not shown) to be protected is represented by impedance Z and is connected between a node A and the bus line 14. Similarly, a circuit portion 18 of the internal circuit to be protected is connected between a node B and the bus line 14. Finally, a circuit portion 20 of the internal circuit to be protected is connected between a node N and the bus line 14. Since each of the clamping networks 12a–12n are identical in construction, it will be sufficient to explain only one of them, such as clamping network 12a.

As previously pointed out, the clamping network 12a includes a thyristor T1, a diode D1, a trigger resistor R1 and a gain-limiting resistor R2. The thyristor R1 is formed of a lateral PNP-type bipolar transistor Q1 and a lateral NPN-type bipolar transistor Q2. The emitter of the transistor Q1 is connected to the external input/output pin P1. The emitter of the transistor Q1 is further joined to one end of the trigger resistor R1 and the cathode of the diode D1. The base of the transistor Q1 is connected to the other end of the resistor R1, the collector of the transistors Q2, and the node A. The collector of the transistor Q1 is connected to one end of the resistor R2 and to the base of the transistor Q2. The emitter of the transistor Q2 is connected to the other end of the resistor R2, the anode of the diode D1, and the common bus line 14. The circuit portion 16 of the internal circuit to be protected is connected between the node A and the common bus line 14.

These clamping networks 12a–12n are designed so that the forward and reverse breakdown voltages are higher than the maximum operating voltage of the internal circuit to be protected. Thus, the protection circuit 10 is not operative under normal conditions so as to avoid interfering with the operation of the internal circuit. Therefore, the clamping networks 12a–12n come into play only when voltages at the corresponding external input/output pins reach a level which is somewhat higher than normal or a predetermined value.

Assume that a positive surge or transient voltage is applied to the external input/output pin P1 and the external input/output pin P2 is referenced to a ground potential. The circuit portion 16 of the internal circuit is protected by the thyristor T1 in the clamping network 12a and the diode D1 in the clamping network 12b. In particular, the resistor R1 is of a low resistance and will trigger on the thyristor T1 when the voltage drop across it is sufficient to render conductive the transistor Q1. This will prevent a surge current exceeding $V_{BE(Q1)}R1$ (where $V_{BE(Q1)}$ is the base-emitter voltage of the transistor Q1) from flowing into the circuit portion 16 when the impedance Z is low. In oher words, the transistors Q1 and Q2 (thyristor T1) are both turned on so as to absorb the surge current which is about to flow into the circuit portion 16 connected to the node A. This surge current will then flow through the common bus line 14 and the diode D1 in the clamping network 12b and out the external input/output pin P2.

A similar analysis may be done with any two pins (other than the substrate pin PS) to show that there will always be a discharge path utilizing a single thyristor and a single diode so as to protect the circuit portion. This will also be true for either a positive or negative transient being applied to the external pins. When an ESD is applied between any one of the external input/output pins P1–Pn and the external substrate pin PS, it can be seen that a discharge path will exist through either the thyristor T1 or the diode D1 in one of the corresponding clamping networks 12a–12n. As a result, there is provided protection from electrostatic discharge build-up on any one of the external pins (P1–Pn, PS) and a subsequent discharge through any one of the remaining external pins, thereby preventing inadvertent damage to the circuit portions 16, 18, 20 of the internal circuit to be protected on the integrated circuit.

The trigger resistor R1 is not required when the impedance Z of the circuit portions 16, 18, 20 is high. When the trigger resistor R1 is not used, then a current equal to the forward voltage breakdown of the thyristor T1 divided by the impedance Z will flow into the corresponding circuit portions of the internal circuit. Since the thyristor T1 can also be triggered on during fast voltage transients (dV/dt), the resistor R2 is used to limit the current gain of the thyristor and thus prevents the thyristor from triggering on at lower voltages during normal circuit operation. Therefore, the resistor R2 may or may not be required depending upon the particular circuit application and the characteristics of the thyristor.

It should be understood to those skilled in the art that the construction of such a protection circuit 10 having clamping networks 12a–12n wherein each is formed of individual components T1 (Q1 and Q2), D1, R1 and R2 can be achieved in accordance with well-known integrated circuit fabrication techniques. Further, the individual component and the protection circuit can be constructed using commercially available integrated circuit fabrication machines. In practice, various configurations of the individual components in the clamping network may be implemented in accordance with the best practical geometric design and layout of the particular integrated circuit for which the protection circuit 10 is used.

FIG. 2 provides one example of a plan view (top) layout of the clamping network 12a of the present invention. The PNP-type transistor Q1 is integrated in a p-type semiconductor substrate as a lateral device. The base of the transistor Q1 is an n-type epitaxial layer which is grown on the semiconductor substrate. The emitter of the transistor Q1 is a p-base contact diffusion formed in the epitaxial layer. The collector of the transistor Q1 is a p-type isolation region contained within the substrate. The NPN-type transistor Q2 is also a lateral device. The collector of the transistor Q2 is the same epitaxial layer forming the base of the transistor Q1. The base of the transistor Q2 is the same isolation region forming the collector of the transistor Q1. The emitter of the transistor Q2 is another n-type epitaxial layer formed in the substrate.

The diode D1 is made up of the substrate and the epitaxial layer forming the emitter of the transistor Q1. The resistor is merged in the same epitaxial layer of the diode D1 and is formed by emitter diffusion as a part of the base of the transistor Q1. The resistance value of the resistor R1 is determined by emitter diffusion resistivity, contact spacing, and diffusion width. The resistor R2 is made up of the isolation region which forms the collector of the transistor Q1 and the base of the transistor Q2. As can be seen, the resistor is comprised of two resistors R2A and R2B whose ends are joined between the isolation region and the common substrate bus line. The resistance values of the resistors R2A and R2B are determined by isolation resistivity, isolation width, bulk substrate resistivity, and the distance from the isolation region between the transistor Q1 and Q2 to the contact areas of the resistors R2A, R2B.

From the foregoing detailed description, it can thus be seen that the present invention provides an improved protection circuit for semiconductor integrated circuits having bipolar transistors to prevent inadvertent damage caused by electrostatic discharge which includes a plurality of clamping networks. Each of the clamping networks of the present invention includes a single thyristor and a single diode.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. A protection circuit for bipolar integrated circuits to prevent inadvertent damage caused by electrostatic discharge, comprising:

a plurality of clamping networks (12a–12n), each of said plurality of clamping networks (12a–12n) being connected between a corresponding one of a number of external input/output pins (P1–Pn) of the integrated circuit and a common bus line (14) which is connected to an external substrate pin (PS);

each of said plurality of clamping networks (12a–12n) including a silicon-controlled rectifier (T1), a diode (D1), a first resistor (R1), and a second resistor (R2);

said silicon-controlled rectifier (T1) being formed of a PNP-type bipolar transistor (Q1) and an NPN-type bipolar transistor (Q2), said PNP-type transistor (Q1) having its emitter connected to the corresponding external input/output pin, its base connected to the collector of said NPN-type transistor (Q2) at a corresponding node, and its collector connected to the base of said NPN-type transistor (Q2), said NPN-type transistor (Q2) having its emitter connected to the common bus line (14);

said diode (D1) having its cathode connected to the emitter of said PNP-type transistor (Q1) and its anode connected to the common bus line (14);

said first resistor (R1) having its one end connected to the emitter of said PNP-type transistor (Q1) and its other connected to the base of said PNP-type transistor (Q1);

said second resistor (R2) having its one end connected to the base of said NPN-type transistor (Q2) and its other end connected to the emitter of said NPN-type transistor (Q1); and internal circuit portions to be protected from the electrostatic discharge being connected between a respective one of the corresponding nodes and the common bus line (14).

whereby when any one of the number of external input/output pins (P1–Pn) receives a voltage higher than a predetermined value and another remaining one of the external input/output pine (P1–Pn) contacts a ground potential a discharge path is formed by a single silicon-controlled rectifier in one of said plurality of clamping networks and a single diode in another one of said plurality of clamping networks so as to protect said internal circit portions.

2. A protection circuit as claimed in claim 1, wherein said first resistor (R1) serves as a trigger resistor for controlling the turning on of the silicon-controlled rectifier (T1) when the internal circuit portion to be protected has a low impedance.

3. A protection circuit as claimed in claim 2, wherein said second resistor (R2) serves as a gain-limiting resistor so as to prevent triggering of the silicon-controlled rectifier (T1) at low voltages during a fast voltage transient.

* * * * *